United States Patent
Tsai et al.

(10) Patent No.: US 7,432,188 B2
(45) Date of Patent: Oct. 7, 2008

(54) STRUCTURE OF BUMPS FORMING ON AN UNDER METALLURGY LAYER AND METHOD FOR MAKING THE SAME

(75) Inventors: Chi-Long Tsai, Kaohsiung (TW); Wan-Huei Lu, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/601,684

(22) Filed: Nov. 20, 2006

(65) Prior Publication Data

US 2007/0117368 A1   May 24, 2007

(30) Foreign Application Priority Data

Nov. 21, 2005   (TW) ............... 94140860 A

(51) Int. Cl.
*H01L 21/44* (2006.01)
(52) U.S. Cl. ...................... 438/614; 257/738
(58) Field of Classification Search ......... 438/612–614; 257/E21.508
See application file for complete search history.

(56) References Cited

U.S. PATENT DOCUMENTS

| | | | |
|---|---|---|---|
| 3,821,785 A * | 6/1974 | Rose et al. ................ 257/751 |
| 5,376,584 A | 12/1994 | Agarwala | |
| 5,937,320 A * | 8/1999 | Andricacos et al. ......... 438/614 |
| 6,569,752 B1 | 5/2003 | Homma et al. | |
| 6,774,026 B1 | 8/2004 | Wang et al. | |
| 2004/0266161 A1 | 12/2004 | Horng | |
| 2007/0087544 A1 * | 4/2007 | Chang et al. ................ 438/612 |

\* cited by examiner

*Primary Examiner*—Thao X. Le
*Assistant Examiner*—Kimberly Trice
(74) *Attorney, Agent, or Firm*—Volentine & Whitt, P.L.L.C.

(57) ABSTRACT

A structure of bumps formed on an under bump metallurgy layer (UBM layer) and a method for making the same, wherein the structure includes a wafer, a UBM layer, a second photo resist and a bump. The wafer has a plurality of solder pads and a protection layer, and the protection layer covers the surface of the wafer and exposes parts of the solder pads. The UBM layer is disposed on the solder pads and the protection layers, and has an undercut structure. The second photo resist is disposed in the undercut structure. The bump is disposed on the UMB layer, so that the UMB layer will not react with the bump during a reflow process and the problem of stress concentration will be avoided so as to make the bump more stable.

9 Claims, 7 Drawing Sheets

STRUCTURE OF BUMPS FORMING ON AN UNDER METALLURGY LAYER AND METHOD FOR MAKING THE SAME

BACKGROUND OF THE INVENTION

1. Field of the Invention

The invention relates to a structure with bumps, particularly to a structure of bumps forming on an under bump metallurgy layer and a method for making the same.

2. Description of the Related Art

FIGS. 1A to 1F show a conventional method for forming bumps on the under bump metallurgy layer. Firstly, referring to FIG. 1A, a wafer 10 is provided. The wafer 10 has an active surface 101, and the active surface 101 has a plurality of solder pads 103. A protection layer 102 covers the active surface 101. The protection layer 102 has a plurality of openings 104, wherein the openings 104 are correspondingly on the solder pads 103 so as to expose parts of the solder pads 103. Referring to FIG. 1B, an under bump metallurgy layer 11 (UBM layer) is formed on the protection layer 102 and the solder pads 103. The under bump metallurgy layer 11 comprises an adhesion layer 111, a stress buffer layer 112 and a wetting layer 113. The solder pads 103 electrically connect to the under bump metallurgy layer 11.

A first photo resist 12 is formed on the first under bump metallurgy layer 111. The first photo resist 12 has a plurality of openings 121, and the openings 121 are formed on the under bump metallurgy layer 11, corresponding to the solder pads 103. Referring to FIG. 1C, a solder paste 13 is filled into the openings 121 of the first photo resist 12. Referring to FIG. 1D, the first photo resist 12 is then removed. Referring to FIG. 1E, the adhesion layer 111 is etched so that the adhesion layer 111, the stress buffer layer 112 and the wetting layer 113 are of the same width. Referring to FIG. 1F, the solder paste 13 is heated to form a bump 14.

According to the conventional method for forming bumps on the under bump metallurgy layer, since the size of the adhesion layer 111 is the same as those of the stress buffer layer 112 and the wetting layer 113, the molten solder paste 13 flows down to the lateral of stress buffer layer 112 during a reflow process. Therefore, the problem of stress concentration will happen so that the bump 14 is unstable and peels easily due to the IMC (Intermetallic Compounds) formed between the bump 14 and stress buffer layer 112.

Consequently, there is an existing need for providing a structure of bumps forming on the under bump metallurgy layer and a method for making the same to solve the above-mentioned problems.

SUMMARY OF THE INVENTION

One objective of the present invention is to provide a method for forming bumps on an under bump metallurgy layer. The method comprises the following steps of: (a) providing a wafer, having a plurality of solder pads and a protection layer, the protection layer covering a surface of the wafer and exposing parts of the solder pads; (b) forming a first under bump metallurgy layer (UBM layer) on the protection layer and the solder pads; (c) forming a first photo resist on the first under bump metallurgy layer; (d) patterning the first photo resist to form a plurality of openings, and the openings formed on the first under bump metallurgy layer and corresponding to the solder pads; (e) plating a second under bump metallurgy layer and a metal bump in the opening of the first photo resist; (f) removing the first photo resist; (g) removing part of the first under bump metallurgy layer and the second under bump metallurgy layer so as to form an undercut structure under and around the first and second under bump metallurgy layers; (h) forming a second photo resist on the protection layer and filling the undercut structure with the second photo resist; (i) removing the part of second photo resist so as to form a residual of the second photo resist in the undercut structure; and (j) reflowing the metal bump to form a ball sharp bump.

According to the method for forming bumps on the under bump metallurgy layer of the present invention, the undercut structure is formed near and around the bottom of the under bump metallurgy layer so that the under bump metallurgy layer will not be reacted with the metal bump in a reflow process and the problem of stress concentration will be avoided so as to make the bump more stable.

DETAILED DESCRIPTION OF THE INVENTION

Figure 1A:
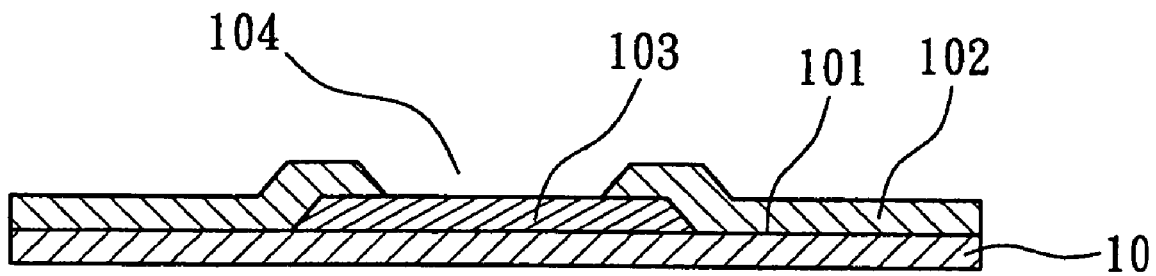
FIGS. 1A to 1F show a conventional method for forming bumps on an under bump metallurgy layer.
Figure 1B:
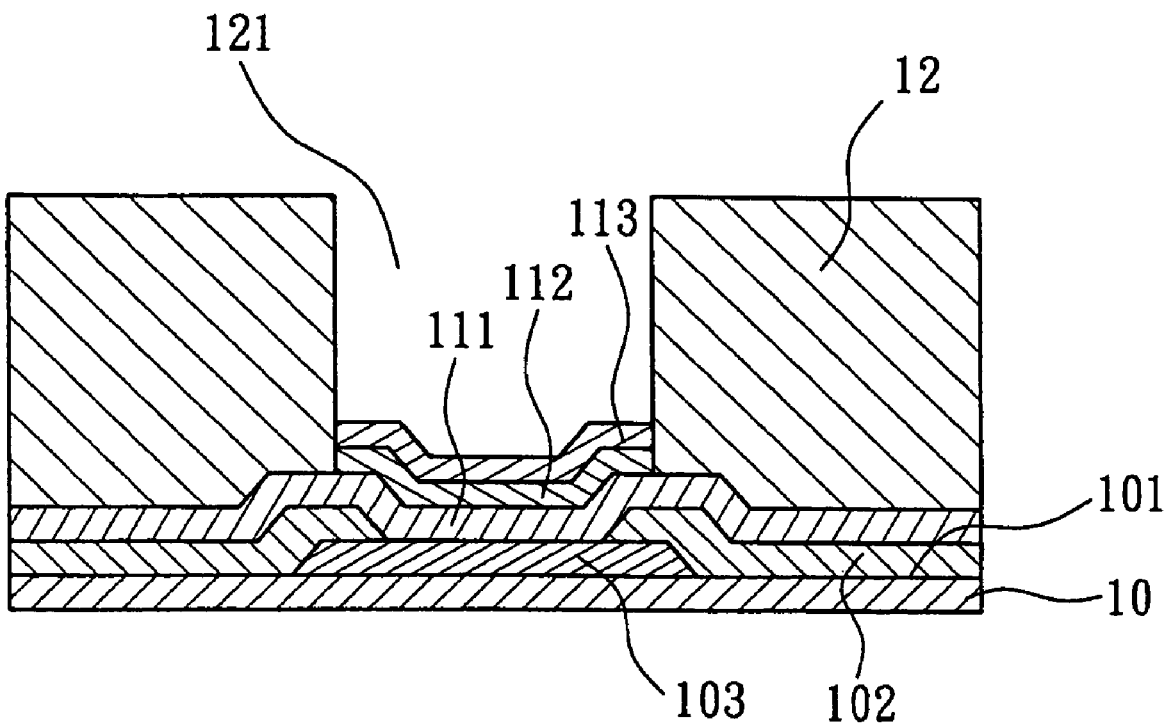
Figure 1C:
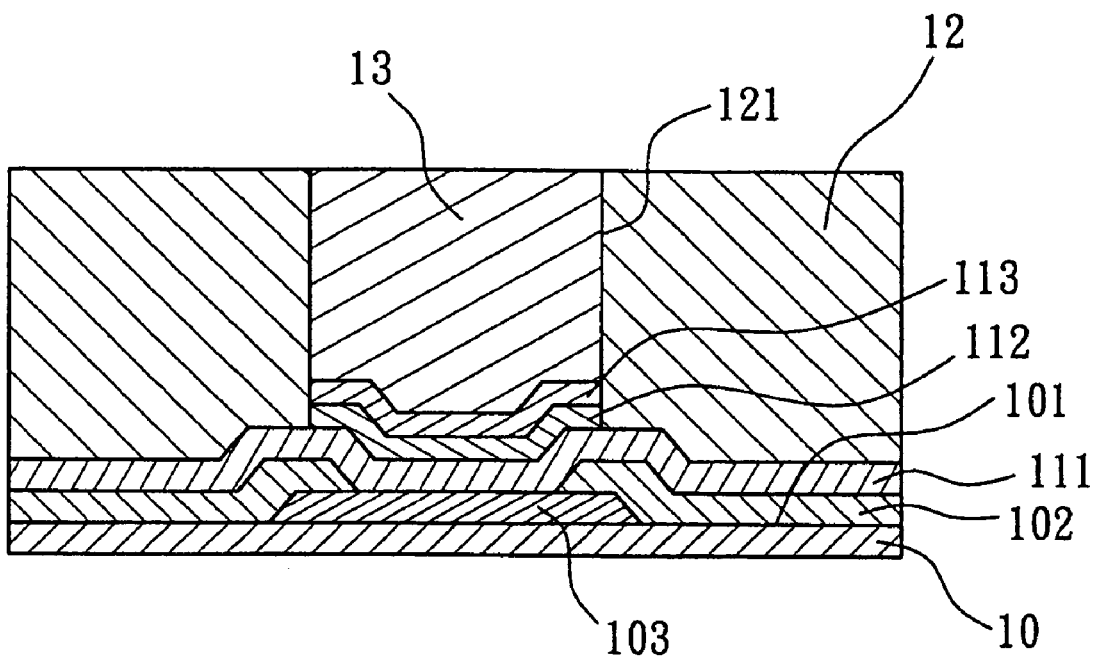
Figure 1D:
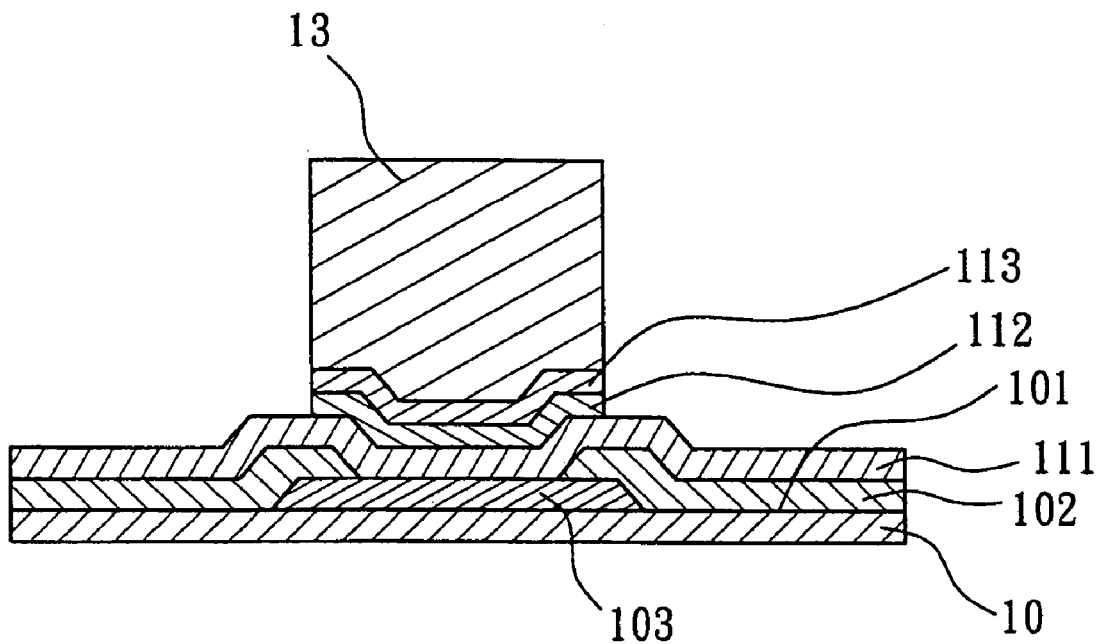
Figure 1E:
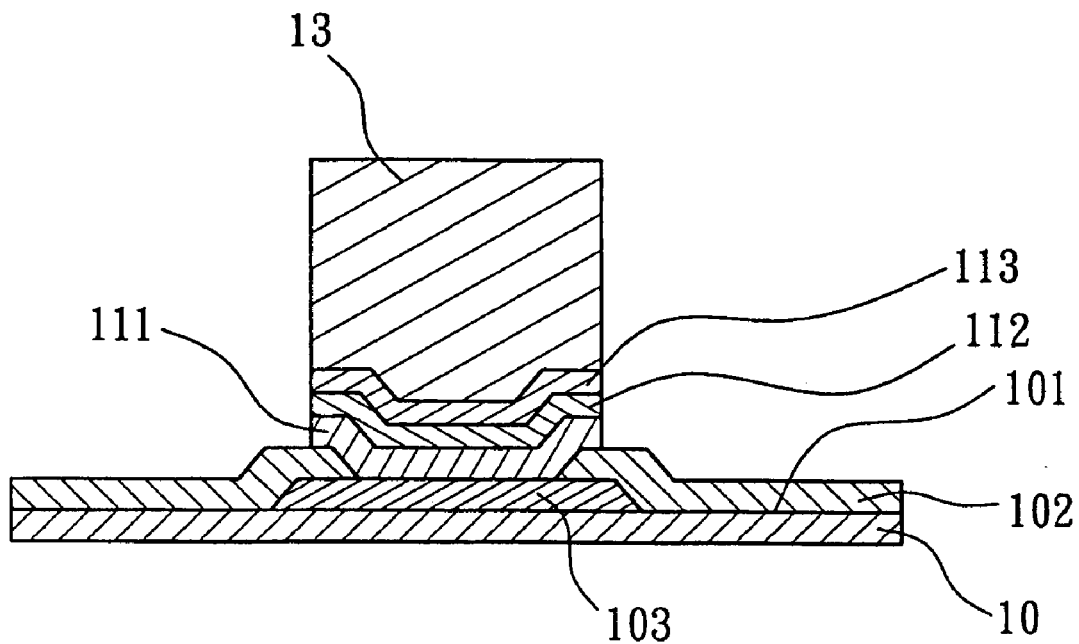
Figure 1F:
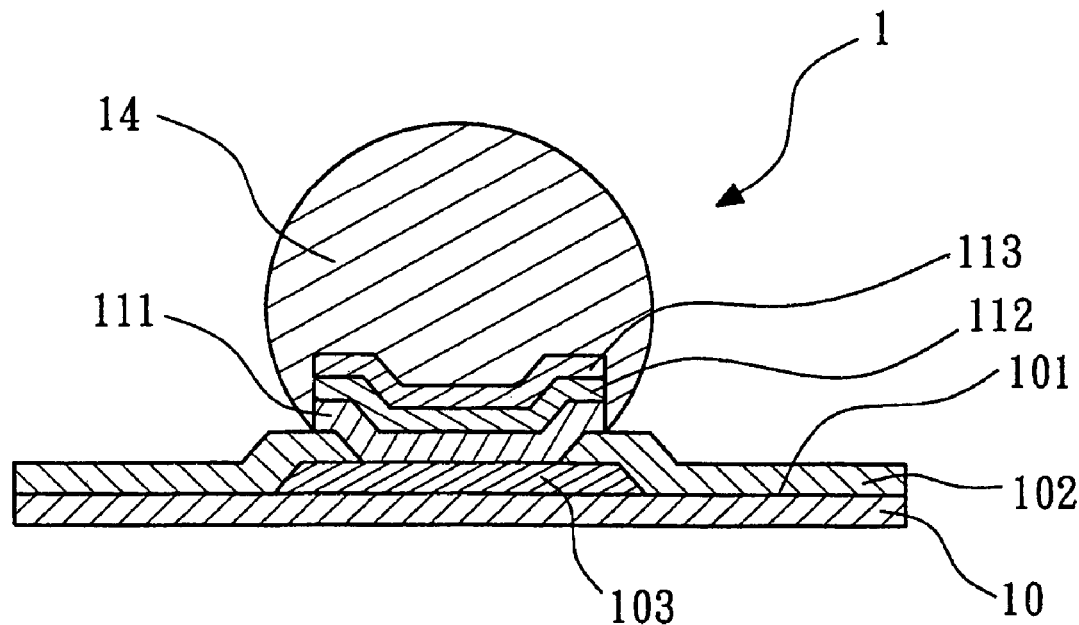

FIGS. 2A to 2H show a method for forming bumps on the under bump metallurgy layer according to the present invention. Firstly, referring to FIG. 2A, a wafer 20 is provided. The wafer 20 has an active surface 201, and the active surface 201 has a plurality of solder pads 203. A protection layer 202 covers the active surface 201. The protection layer 202 has a plurality of openings 204, wherein the openings 204 are correspondingly on the solder pads 203 so as to expose parts of the solder pads 203.

Figure 2A:
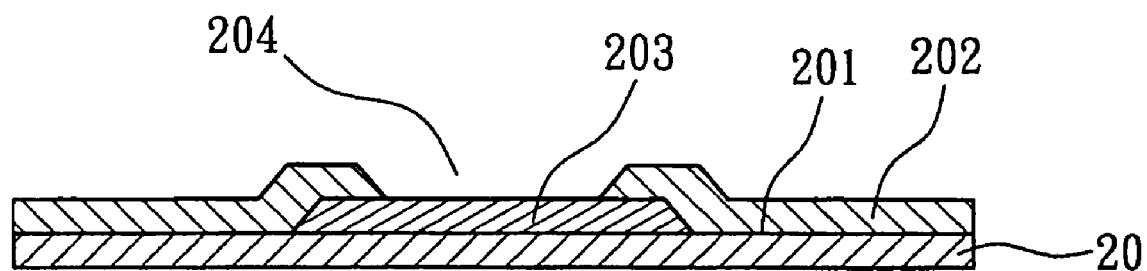
FIGS. 2A to 2H show a method for forming bumps on an under bump metallurgy layer according to the present invention; wherein the FIG. 2I shows the structure of forming bumps on the under bump metallurgy layer.
Figure 2B:
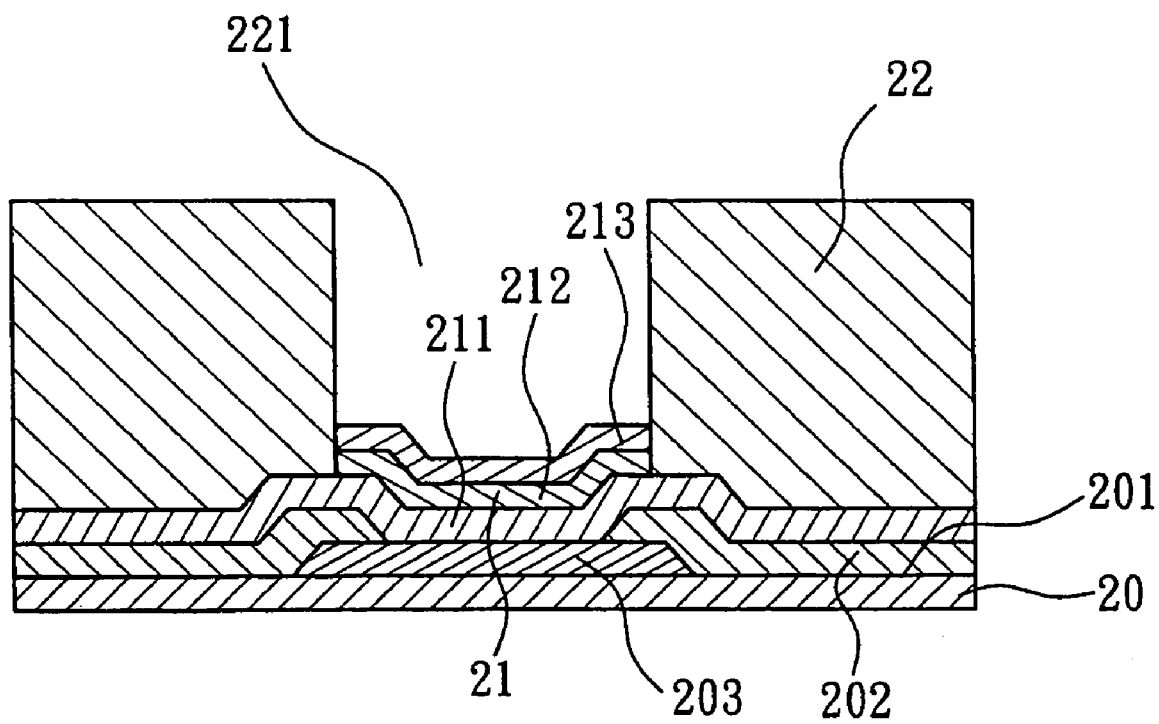

Referring to FIG. 2B, an under bump metallurgy layer 21 (UBM layer) is formed on the protection layer 202 and the solder pads 203. The under bump metallurgy layer 21 comprises a first under bump metallurgy layer 211 to be an adhesion layer, a second under bump metallurgy layer 212 to be a stress buffer layer and a third under bump metallurgy layer 213 to be a wetting layer. In the embodiment, the first under bump metallurgy layer 211 is formed by sputtering, and the second under bump metallurgy layer 212 and the third under bump metallurgy layer 213 are formed by plating. The solder pads 203 electrically connect to the under bump metallurgy layer 21.

In FIG. 2B, firstly, the first under bump metallurgy layer 211 is formed on the protection layer 202 and the solder pads 203. Then, a first photo resist 22 is formed on the first under bump metallurgy layer 211. A plurality of openings 221 are formed by patterning the first photo resist 22, wherein the openings 221 are formed on the first under bump metallurgy layer 211, corresponding to the solder pads 203. Finally, the second under bump metallurgy layer 212 is formed in the opening 221 of the first photo resist 22. Furthermore, the third under bump metallurgy layer 213 is formed in the opening 221 of the first photo resist 22 after plating the second under bump metallurgy layer 212, and the step is optional.

Figure 2C:
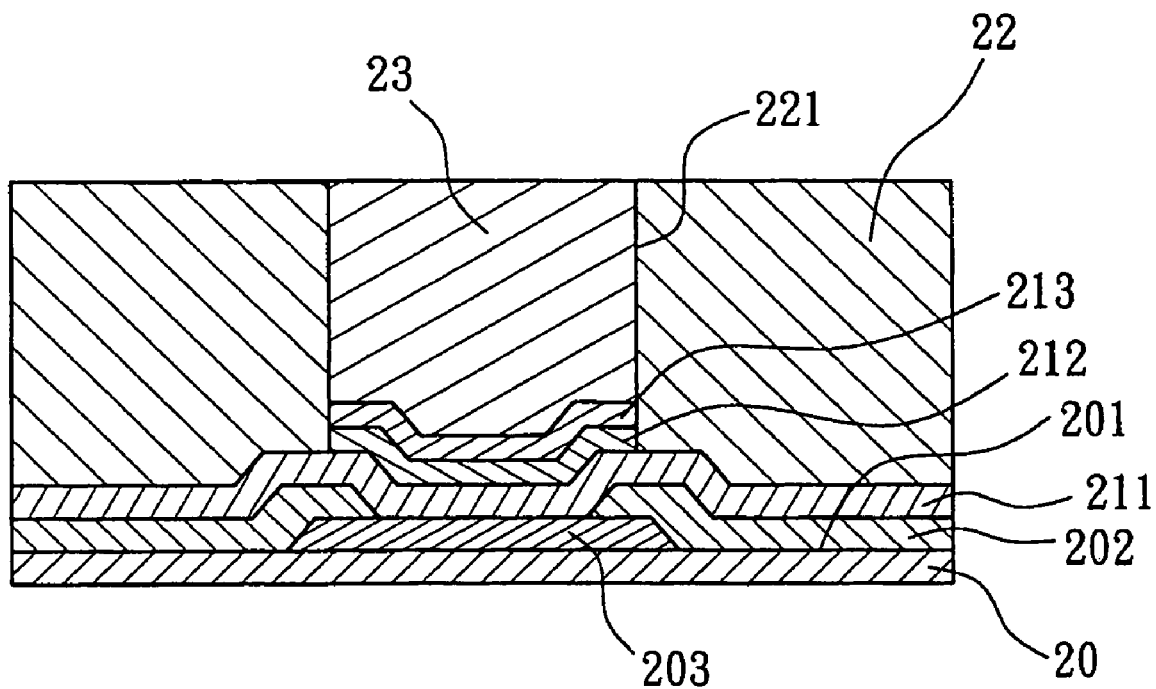
Figure 2D:
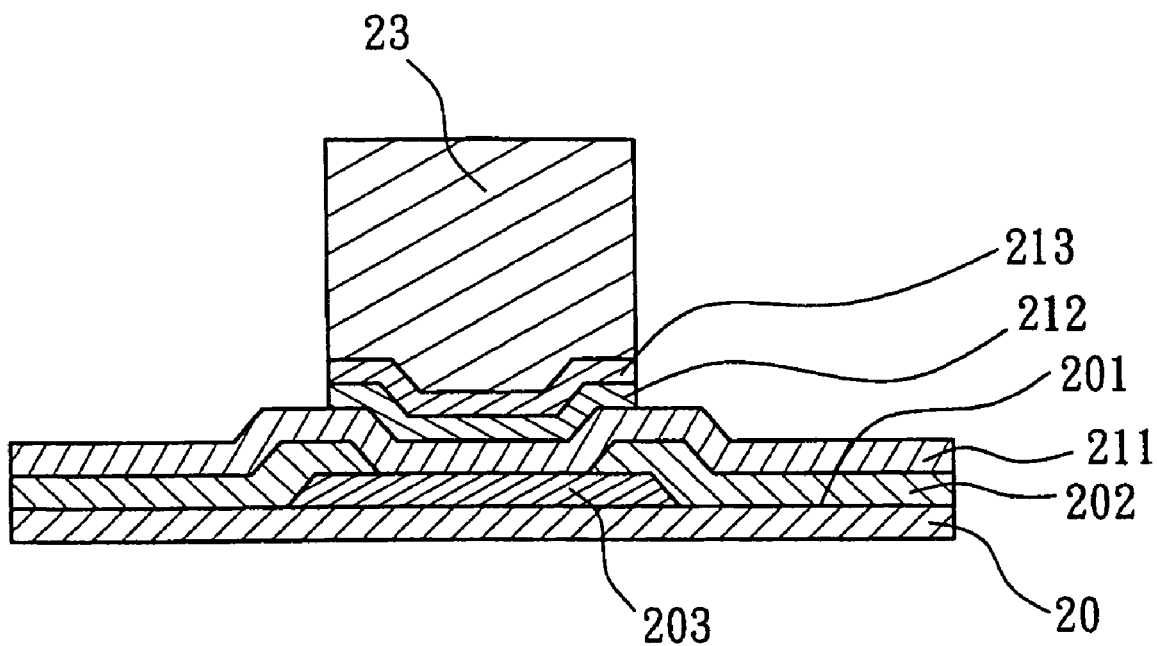
Figure 2E:
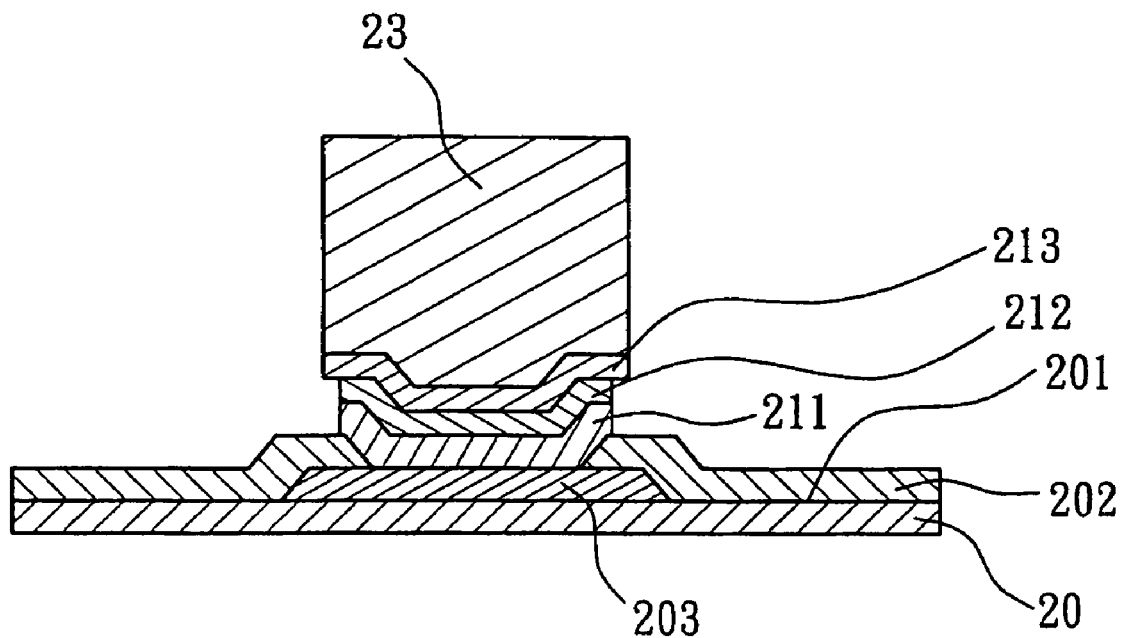

Referring to FIG. 2C, a metal bump 23 is plated in the opening 221 of the first photo resist 22. Referring to FIG. 2D, the first photo resist 22 is removed. Referring to FIG. 2E, part of the first under bump metallurgy layer 211 and the second under bump metallurgy layer 212 are removed so that the widths of the first under bump metallurgy layer 211 and the second under bump metallurgy layer 212 are less than that of the third under bump metallurgy layer 213, and an undercut structure is therefore formed under and around the first under bump metallurgy layer 211 and the second under bump metallurgy layer 212.

Figure 2F:
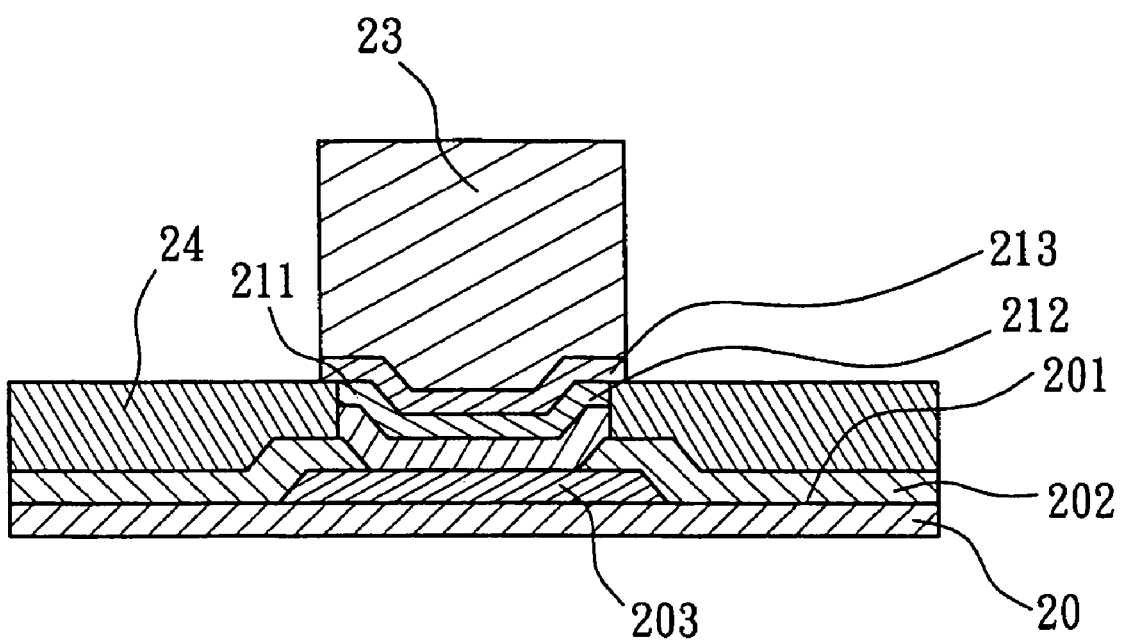
Figure 2G:
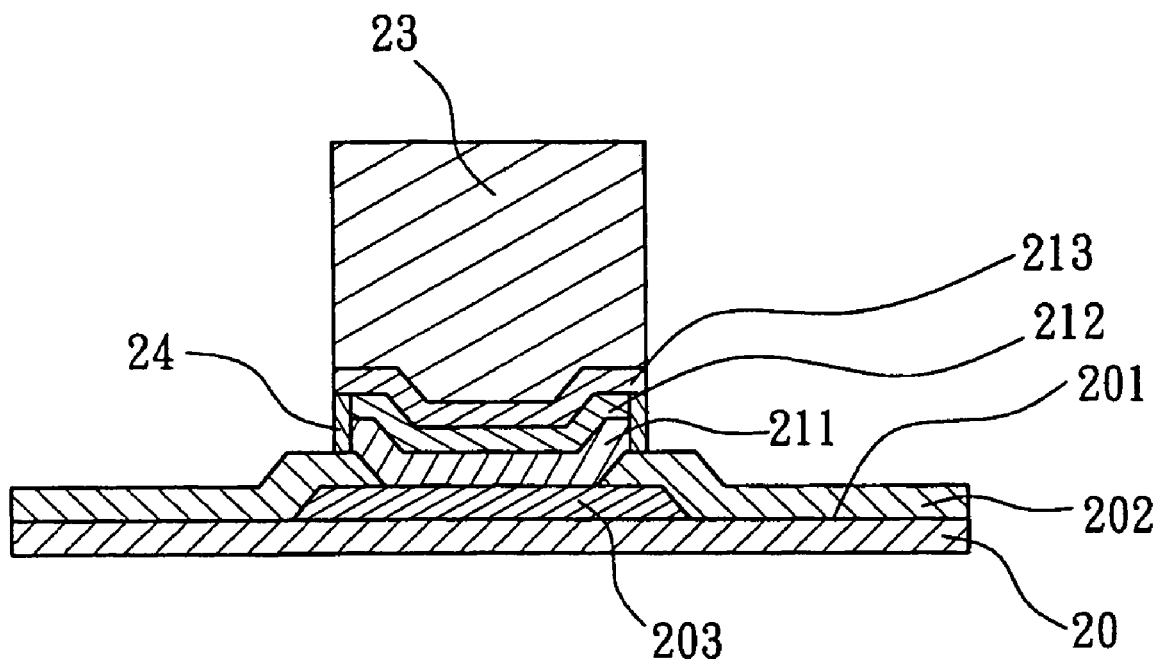
Figure 2H:
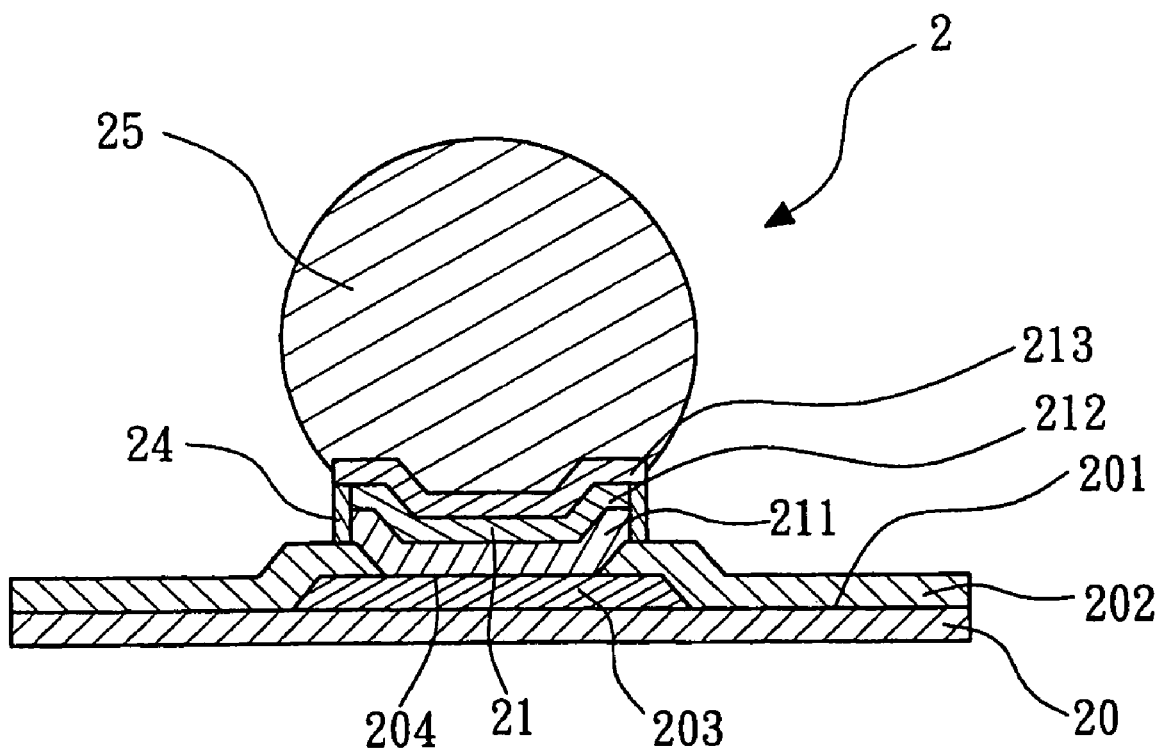

Referring to FIG. 2F, a second photo resist 24 is formed on the protection layer 202 and fills the undercut structure. Referring to FIG. 2G, an exposure and development process proceeds so that the second photo resist 24 aligns to the wetting layer 213. . Referring to FIG. 2H, the metal bump 23 is reflowed so as to form a stable conductive bump 25. In another application, the second photo resist 24 may be totally removed by using exposure and development after reflow processing.

Referring to FIG. 2H again, it shows the structure of bumps forming on the under bump metallurgy layer. The structure 2 comprises a wafer 20, an under bump metallurgy layer 21, a second photo resist 24 and a conductive bump 25. The wafer 20 has an active surface 201, and the active surface 201 has a plurality of solder pads 203. A protection layer 202 covers the active surface 201. The protection layer 202 has a plurality of openings, wherein the openings are correspondingly on the solder pads 203 so as to expose parts of the solder pads 203.

The under bump metallurgy layer 21 is disposed on the protection is layer 202 and the solder pads 203. The under bump metallurgy layer 21 comprises an adhesion layer 211, a stress buffer layer 212 and a wetting layer 213, wherein the stress buffer layer 212 is disposed on the adhesion layer 211, and the wetting layer 213 is disposed on the stress buffer layer 212. The widths of the adhesion layer 211 and the stress buffer layer 212 are less than that of the wetting layer 213 so as to form an undercut structure. The adhesion layer 211, the stress buffer layer 212 and the wetting layer 213 are conductive material. The wetting layer 213 is 1 to 5 micrometer(s) wider than the stress buffer layer 212 and the adhesion layer 211.

The second photo resist 24 is disposed on the protection layer 202 and in the undercut structure. The second photo resist 24 aligns to the wetting layer 213, and the height of the second photo resist 24 is the same as that of the stress buffer layer 212. The second photo resist 24 is a non-conductive material. In an other application, the second photo resist 24 may be a conductive material. The conductive bump 25 only connects to the wetting layer 213. The conductive bump 25 is formed on the under bump metallurgy layer 21 and electrically connects to the solder pads 203 through the under bump metallurgy layer 21. The bump 25 and the stress buffer layer 212 are separated by the wetting layer 213 and the second photo resist 24.

According to the structure 2 of the present invention, the undercut structure is formed near and around the bottom of the under bump metallurgy layer 21, wherein the wetting layer 213 is wider than the stress buffer layer 212 and the adhesion layer 211 so as to avoid the conductive bump 25 contacting the stress buffer layer 212 and the adhesion layer 211. Furthermore, the second photo resist 24 is used to protect the stress buffer layer 212 and the adhesion layer 211, whereby the under bump metallurgy layer 21 will not be reacted with the conductive bump 25 in the reflow process and the problem of stress concentration will be avoided so as to make the conductive bump 25 more stable.

While the embodiments of the present invention have been illustrated and described, various modifications and improvements can be made by those skilled in the art. The embodiments of the present invention are therefore described in an illustrative but not restrictive sense. It is intended that the present invention may not be limited to the particular forms as illustrated, and that all modifications that maintain the spirit and scope of the present invention are within the scope as defined in the appended claims.

What is claimed is:

1. A method for forming bumps on an under bump metallurgy layer, the method comprising the following steps of:
   (a) providing a wafer, having a plurality of solder pads and a protection layer, the protection layer covering a surface of the wafer and exposing parts of the solder pads;
   (b) forming a first under bump metallurgy layer (UBM layer) on the protection layer and the solder pads;
   (c) forming a first photo resist on the first under bump metallurgy layer;
   (d) patterning the first photo resist to form a plurality of openings, and the openings formed on the first under bump metallurgy layer corresponding to the solder pads;
   (e) forming a second under bump metallurgy layer in the opening of the first photo resist;
   (f) plating a metal bump in the opening of the first photo resist;
   (g) removing the first photo resist;
   (h) removing part of the first and second under bump metallurgy layers so as to form an undercut structure under and around the first and second under bump metallurgy layers;
   (i) forming a second photo resist on the protection layer and filling the undercut structure with the second photo resist;
   (j) removing the part of the second photo resist to form residual of the second photo resist only in the undercut structure before reflowing the metal bump processing; and
   (k) reflowing the metal bump.

2. The method according to claim 1, further comprising a step of plating a third under bump metallurgy layer in the opening of the first photo resist after plating the second under bump metallurgy layer in step (e).

3. The method according to claim 2, wherein the first under bump metallurgy layer comprises an adhesion layer, the second under bump metallurgy layer comprises a stress buffer layer and the third under bump metallurgy layer comprises a wetting layer.

4. The method according to claim 3, wherein the third under bump metallurgy layer is formed by plating.

5. The method according to claim 2, wherein the width of the first under bump metallurgy layer and the width of the second bump metallurgy layer are less than that of the third under bump metallurgy layer.

6. The method according to claim 1, wherein the first under bump metallurgy layer is formed by sputtering.

7. The method according to claim 1, wherein the second under bump metallurgy layer is formed by plating.

8. The method according to claim 1, wherein the removing part of the first and second under bump metallurgy layers process comprises an etching process.

9. The method according to claim 1, wherein the residual of the second photo resist is formed by using exposure and development processes.

* * * * *